US005635426A

United States Patent [19]
Hayashi et al.

[11] Patent Number: 5,635,426
[45] Date of Patent: Jun. 3, 1997

[54] METHOD OF MAKING A SEMICONDUCTOR DEVICE HAVING A SILICIDE LOCAL INTERCONNECT

[75] Inventors: Hiromi Hayashi; Atsuo Fushida; Tetsuo Izawa; Masaki Katsube; Tatsuya Yamazaki, all of Kawasaki, Japan

[73] Assignee: Fujitsu Limited, Kawasaki, Japan

[21] Appl. No.: 527,893

[22] Filed: Sep. 14, 1995

Related U.S. Application Data

[63] Continuation-in-part of Ser. No. 295,537, Aug. 25, 1994, Pat. No. 5,482,895.

[30] Foreign Application Priority Data

Aug. 26, 1993 [JP] Japan ................................. 5-211279
Apr. 4, 1995 [JP] Japan ................................. 7-078977

[51] Int. Cl.$^6$ ................................................ H01L 21/28
[52] U.S. Cl. ........................ 438/453; 438/233; 438/586; 438/664; 438/682
[58] Field of Search ................................. 437/193, 200, 437/201

[56] References Cited

U.S. PATENT DOCUMENTS

| | | |
|---|---|---|
| 4,821,085 | 4/1989 | Haken et al. . |
| 4,873,204 | 10/1989 | Wong et al. . |
| 4,925,812 | 5/1990 | Gould ................................. 437/200 |
| 4,994,402 | 2/1991 | Chiu ................................... 437/200 |
| 5,010,032 | 4/1991 | Tang et al. . |
| 5,041,394 | 8/1991 | Spratt et al. ....................... 437/201 |
| 5,047,367 | 9/1991 | Wei et al. ........................... 437/200 |
| 5,190,893 | 3/1993 | Jones, Jr. et al. . |
| 5,266,156 | 11/1993 | Nasr .................................... 437/200 |
| 5,352,631 | 10/1994 | Sitaram et al. .................... 437/200 |
| 5,366,928 | 11/1994 | Wolters et al. ..................... 437/200 |
| 5,387,535 | 2/1995 | Wilmsmeyer . |
| 5,403,759 | 4/1995 | Havemann ......................... 437/200 |
| 5,443,996 | 8/1995 | Lee et al. ............................ 437/200 |

OTHER PUBLICATIONS

S. Wolf, Silicon Processing for the VLSI Era, vol. 2, Lattice Press 1990, pp. 162–167.

*Primary Examiner*—Jey Tsai
*Assistant Examiner*—Thomas G. Bilodeau
*Attorney, Agent, or Firm*—Armstrong, Westerman, Hattori, McLeland & Naughton

[57] ABSTRACT

On a semiconductor substrate with an exposed silicon region, a metal layer such as Co is deposited and a silicide layer is formed by heat treatment. Thereafter, a metal layer such as Ni and a silicon layer are deposited, and one of them is patterned. The metal layer and silicon layer are heated for silicification to form a local interconnect. A semiconductor device manufacturing method is provided which uses salicide technique and can form a local interconnect of good quality.

31 Claims, 9 Drawing Sheets

METHOD OF MAKING A SEMICONDUCTOR DEVICE HAVING A SILICIDE LOCAL INTERCONNECT

CROSS REFERENCE TO RELATED APPLICATION

This application is a continuation-in-part application of a U.S. patent application, Ser. No. 08/295,537, filed on Aug. 25, 1994, now U.S. Pat. No. 5,482,895.

BACKGROUND OF THE INVENTION

1. Field of the Invention

The present invention relates to a method of manufacturing a silicon semiconductor device, and more particularly to a method of manufacturing a semiconductor device having silicide interconnects.

2. Description of the Related Art

In connecting a conductive pattern formed in the surface of a semiconductor device to another conductive pattern, the surface is once covered with an insulation film a contact hole is formed in the insulation film, and a wiring pattern is formed on the insulation film. This wiring pattern connecting nearby circuits or nodes is called a local interconnect.

A local interconnect for directly connecting a wiring pattern formed on a field oxide film to a diffused region in the substrate surface without forming an interlevel insulation film can dispense with the process of forming an interlevel insulation film and forming a contact hole therein. Such a local interconnect is very suitable for manufacturing fine semiconductor devices and simplifying the manufacture process.

FIGS. 8A to 8D illustrate a method of forming local interconnects using a self-aligned silicide (salicide) technique disclosed in U.S. Pat. No. 4,873,204.

As shown in FIG. 8A, locally oxidized field oxide films 101 are formed on the surface of a silicon substrate 100, and active regions 102A and 102B are surrounded and defined by the locally oxidized field oxide films 101. In the active region 102A, a MOSFET is formed which has a source region 103AS, a drain region 103AD, and a gate electrode 104A. In the active region 103B, another MOSFET is formed which has a source region 103BS, a drain region 103BD, and a gate electrode 104B. On both sides of the gate electrodes 104A and 104B, side wall oxide regions or spacers 105A and 105B are formed. The gate electrodes 104A and 104B extend on the active regions and also the locally oxidized field oxide film in the direction perpendicular to the drawing sheet.

A silicon wiring pattern 104C is formed on a locally oxidized field oxide film 101 at the left-most side, and side wall oxide 105c is formed on both sides of the silicon wiring pattern 104C.

A titanium film 106 is deposited over the whole surface of the substrate, and an amorphous silicon film 107 is deposited thereon.

As shown in FIG. 8B, the silicon film 107 is etched to form amorphous silicon patterns 107A and 107B. The silicon pattern 107A extends from the region over the source region 103AS, to the region over the locally oxidized field oxide film 101, and to the region over the silicon wiring pattern 104C. The silicon pattern 107B extends from the region over the drain region 103AD, to the region over the locally oxidized field oxide film 101, and to the region over the source region 103BS.

After the silicon film 107 is patterned, the substrate 100 is heated for annealing.

As shown in FIG. 8C, the titanium film 106 and the silicon surface contacting it are reacted to form a silicide film. The silicon patterns 107A and 107B react with the titanium film 106 to form silicide layers 108A and 108B.

The upper surfaces of the silicon wiring pattern 104C and gate electrodes 104A and 104B are also reacted with the titanium film 106 to form silicide. The surfaces of the source region 103AS, drain region 103AD, source region 103BS, and drain region 103BD are also reacted with the titanium film 106 to form silicide.

As shown in FIG. 8D, an interlevel insulation film 109 is deposited. A contact hole is formed in the interlevel insulation film 109 to expose the surface of the silicide layer 108B. A metal wiring pattern 110 is formed on the interlevel insulation film 109 and covers the exposed surface of the silicide layer 108B in the contact hole.

With the method of forming local interconnects illustrated in FIGS. 8A to 8D, semiconductor active regions in the surface of a silicon substrate and other regions can be connected together without using contact holes. This method is therefore very effective for manufacturing high density semiconductor integrated circuits.

In the method of forming local interconnects, at the process shown in FIG. 8B the regions where the silicon patterns 107A and 107B are formed are covered with a resist pattern, and the exposed silicon film 107 is selectively etched. After etching, the resist pattern used as the etching mask is removed through plasma ashing or through dissolution by acid-containing etchant.

During the removal of resist, the titanium film 106 at the region not covered with the resist pattern is being exposed. Therefore, the exposed titanium film 106 may be oxidized or sputtered by plasma and thinned. Such damages on the titanium film 106 may result in an inability to form a low resistance and good silicide film at the later silicidation process.

Although local interconnects using salicidation techniques are very effective for forming fine semiconductor devices, it can be said that these techniques are still not mature.

SUMMARY OF THE INVENTION

It is an object of the present invention to provide a method of manufacturing a semiconductor device by using salicidation techniques, capable of forming local interconnects having excellent quality.

According to one aspect of the present invention, there is provided a method of manufacturing a semiconductor device comprising the steps of: (a) forming the first silicide layer of the first metal on the whole surface of an exposed silicon region of a silicon semiconductor substrate; and (b) forming the second silicide layer of the second metal, the second silicide layer extending from a partial area of the surface of the first silicide layer to an area outside of the first silicide layer.

The step (a) may comprise the steps of: forming a locally oxidized field oxide film by selectively oxidizing the surface of the silicon semiconductor substrate and defining a partial silicon surface surrounded by the locally oxidized field oxide film; depositing a first metal film, the first metal film covering the silicon surface and the locally oxidized field oxide film; annealing the substrate to react the first metal film with the silicon surface and form the first silicide layer; and removing an unreacted part of the first metal film.

The step (b) may comprise the steps of: depositing a second metal film, the second metal film covering the first silicide layer and the locally oxidized field oxide film; depositing a silicon film on the second metal film, patterning the silicon film to form a silicon film pattern extending from a region over the surface of the first silicide layer to a region over the locally oxidized field oxide film; annealing the substrate to react the second metal film with the silicon film pattern and form the second silicide layer; and removing an unreacted part of the second metal film.

A metal film reacting with silicon is deposited on a silicon substrate, extending from the substrate surface to a locally oxidized field oxide film. As the substrate is annealed, metal silicide is formed in the silicon substrate surface contacting the metal film, and the resistance of the substrate surface is lowered. Another metal film reacting with silicon is deposited, and a patterned silicon film is deposited thereon. As the substrate is annealed, this metal film and patterned silicon film react each other to form another metal silicide.

Before patterning the silicon film, the metal silicide has been already formed on the silicon substrate surface. Therefore, even if the exposed metal film is damaged during patterning the silicon film, metal silicide of good quality can be formed on the silicon substrate surface.

The step (b) may also comprise the steps depositing a silicon film covering the first silicide layer and the locally oxidized field oxide film; depositing a second metal film on the silicon film, patterning the second metal film to form a metal pattern extending from a region over the surface of the first silicide layer to a region over the locally oxidized field oxide film; annealing the substrate to silicidate the metal pattern with the silicon film pattern and form the second silicide layer; and removing an unreacted part of the silicon film.

In forming the second layer metal silicide, a silicon film may be formed as a lower level layer and a patterned metal film may be formed as a higher level layer. Also in this case, metal silicide of good quality can be formed.

The step (a) may comprise the steps of: forming a locally oxidized field oxide film by selectively oxidizing the surface of the silicon semiconductor substrate and defining a partial silicon surface surrounded by the locally oxidized field oxide film; and depositing a first metal film, the first metal film covering the silicon surface and the locally oxidized field oxide film. The step (b) may comprise the steps of: depositing a second metal film on the first metal film, the second metal film being made of metal different from the first metal and silicidating with silicon; and depositing a silicon film on the second metal film, patterning the silicon film to form a silicon film pattern extending from a region over the silicon surface to a region over the locally oxidized field oxide film. The first and second steps (a) and (b) may comprise the common steps of: annealing the substrate to reacting the first metal film with the silicon surface and the second metal film with the silicon film pattern; and removing unreacted parts of the first and second metal films.

The first metal film and the second metal film reacting with silicon are sequentially deposited on a silicon substrate, extending from the substrate surface to a locally oxidized field oxide film. A silicon film is deposited thereon and patterned. As the substrate is annealed, the metal film contacting the silicon substrate surface and the metal film contacting the patterned silicon film react with each other.

Before patterning the silicon film, the first and second metal films have already been stacked under the silicon film. Therefore, even if the second metal layer is damaged during patterning the silicon film, the first metal layer is not susceptible to damages. During silicidation, since the silicon substrate surface is in contact with the first metal film not damaged, it is possible to form metal silicide of good quality on the surface of the silicon substrate.

It is possible to select optimum metal materials of the metal films of a two-layer structure. For example, as the the second metal layer, material not susceptible to damages during patterning the silicon film is selected.

In this manner, local interconnects of good quality can be formed by using silicidation techniques. With such a local interconnect technique, for example, the integration degree of semiconductor memories can be raised.

DETAILED DESCRIPTION OF THE PREFERRED EMBODIMENTS

Figure 1A:
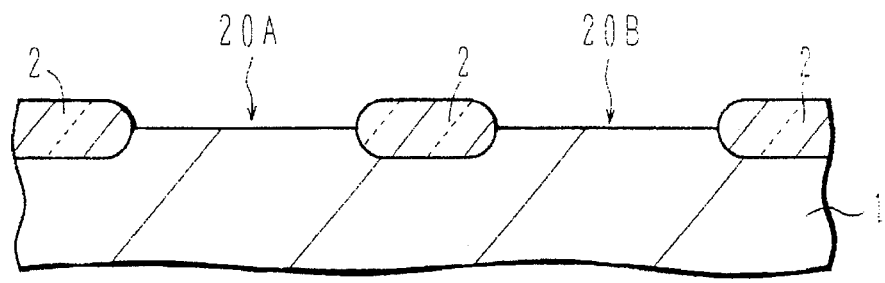
FIGS. 1A to 1D and 2A to 2C are cross sectional views illustrating a method of manufacturing a semiconductor device according to a first embodiment of the invention.

A silicon substrate 1 shown in FIG. 1A is a p-type substrate having a resistivity of 10 $\Omega$cm. The surface of the silicon substrate 1 is selectively oxidized through local oxidation of silicon (LOCOS) to form a field oxide film 2. For example, the substrate temperature is raised to 950° C. and the substrate surface is oxidized for 6 hours in a wet oxygen atmosphere to form a field oxide film 2 of 250 nm thick. The field oxide film 2 defines active regions 20A and 20B.

Figure 1B:
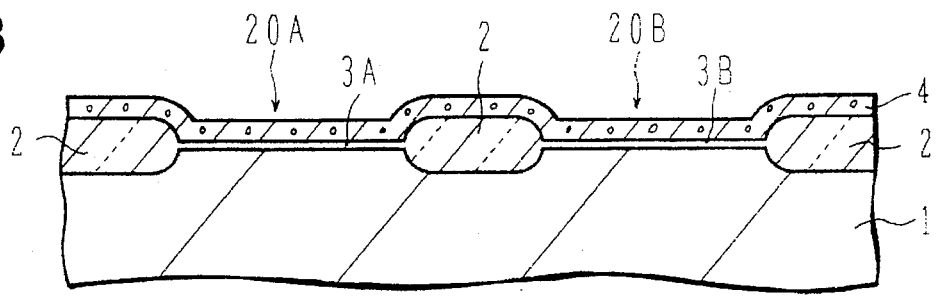

As shown in FIG. 1B, gate oxide films 3A and 3B are formed on the surfaces of the active regions 20A and 20B by thermal oxidation. For example, the substrate temperature is raised to 1000° C. and the substrate surface is oxidized for 10 minutes in an argon diluted dry oxygen atmosphere to form oxide films of 6 nm thick.

A polycrystalline silicon film 4 of 180 nm thick is deposited by chemical vapor deposition (CVD) on the surfaces of the field oxide film 2, and gate oxide films 3A and 3B. For example, the polycrystalline silicon film 4 is grown at a growth temperature of 650° C. by using $SiH_4$ as source gas.

Figure 1C:
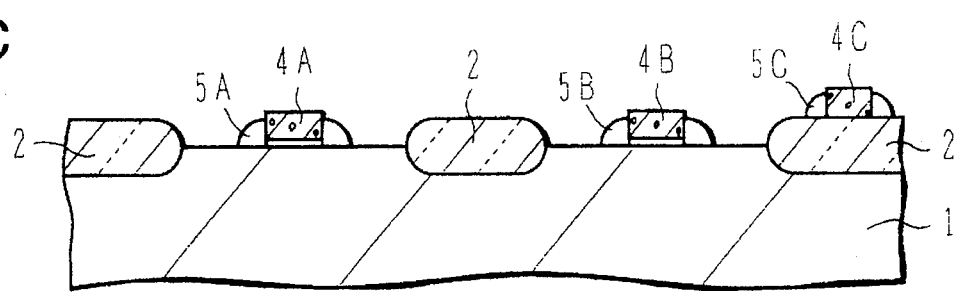

As shown in FIG. 1C, the polycrystalline silicon film 4 is patterned to form gate electrodes 4A and 4B on the gate oxide films 3A and 3B on the surfaces of the active regions 20A and 20B. At the same time, a polycrystalline wiring pattern 4C is formed on the surface of the field oxide film 2 at the right-most side in FIG. 1C. The polycrystalline silicon wiring pattern 4C is in contact with the gate electrode of another MOSFET not shown. Etching the polycrystalline silicon film is performed, for example, by reactive ion etching (RIE) using HBr as etching gas and a resist pattern as an etching mask.

If necessary, n-type impurity ions are implanted by using the gate electrodes as a mask. This ion implantation is performed for forming source/drain regions of a lightly doped drain (LDD) structure. If an LDD structure is not necessary, this ion implantation is omitted.

Next, a silicon oxide film of about 100 nm thick is deposited by CVD. This silicon oxide film is selectively etched by RIE by using mixture gas of $CF_4+CHF_3$ as etching gas to leave side wall oxide regions 5A, 5B, and 5C on both sides of the gate electrodes 4A and 4B and polycrystalline silicon wiring pattern 4C and to remove the silicon oxide film on the other surfaces including the flat surfaces.

Figure 1D:
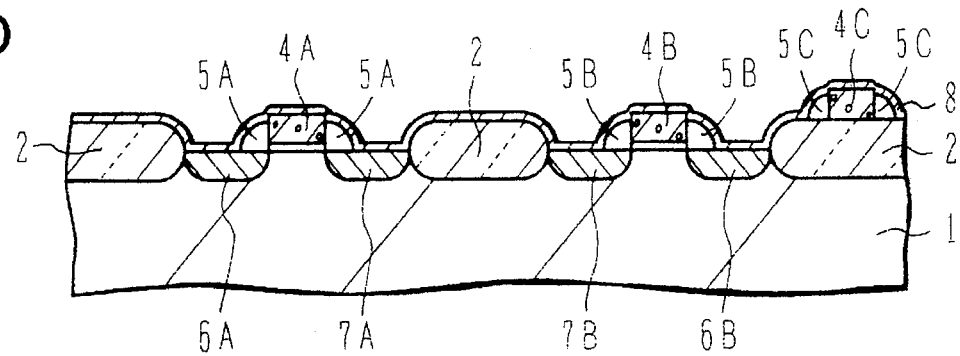

As shown in FIG. 1D, arsenic ions are implanted by using the gate electrodes 4A and 4B, side wall oxide 5A and 5B as a mask. For example, ion implantation is carried out under the conditions of an acceleration energy of 25 keV and a dose of $2\times10^{15}$ cm$^{-2}$. Next, rapid thermal annealing (RTA) is performed for ten minutes at a temperature of 1000° C. by lamp annealing to activate implanted As ions. In this manner, source regions 6A and 6B and drain regions 7A and 7B are formed. At this time, As ions are also doped in the gate electrodes to lower their resistances.

Next, a cobalt (Co) film 8 is deposited through sputtering on the whole surface of the substrate to a thickness of 10 nm. This sputtering process is performed, for example, under the conditions that argon gas as a sputtering gas is flowed by 100 sccm, the pressure in a sputtering chamber is maintained about 0.1 Pa, and an RF power of about 3.7 W/cm$^2$ is supplied to a Co target.

Figure 2A:
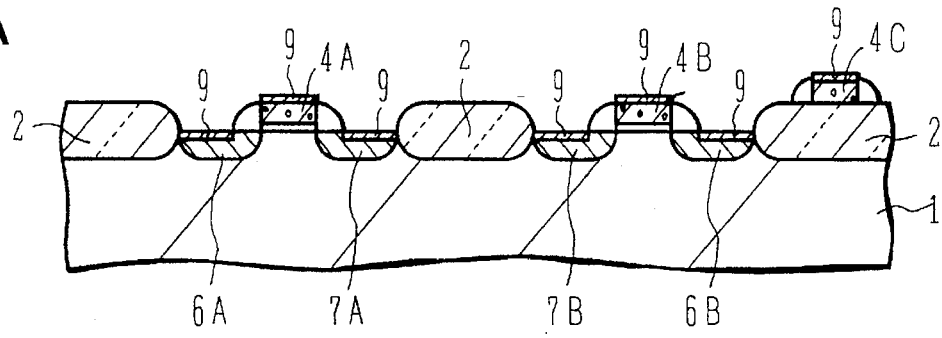

As shown in FIG. 2A, a heat treatment is performed at a temperature of 800° C. for 30 seconds to silicify the Co Film 8 with silicon in contact with it. This silicification forms Co silicide layers 9 on the surfaces of the source regions 6A and 6B, drain regions 7A and 7B, gate electrodes 4A and 4B, and polycrystalline silicon wiring pattern 4C. Thereafter, the unreacted Co film is removed by mixed liquid of hydrogen peroxide and sulfric acid.

Figure 2B:
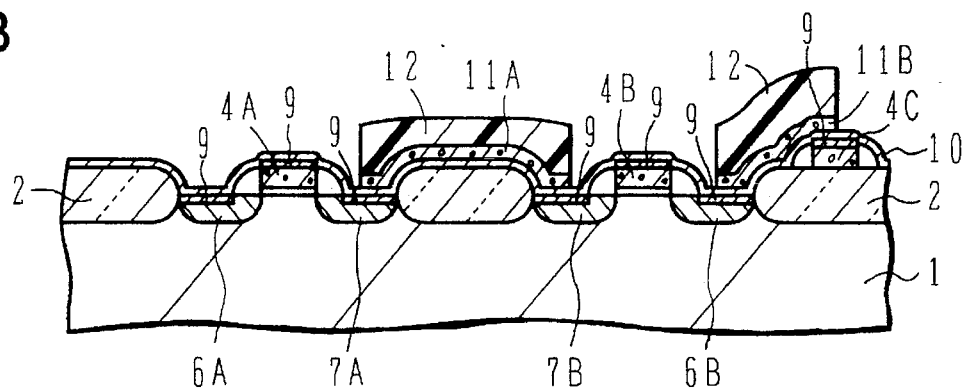

As shown in FIG. 2B, a nickel (Ni) film 10 is deposited by sputtering over the whole surface of the substrate to a thickness of 5 nm. Then, a polycrystalline silicon film is deposited by sputtering. This polycrystalline silicon film is patterned through photolithography using a novolak resist mask 12 to form polycrystalline silicon patterns 11A and 11B.

The polycrystalline silicon pattern 11A extends from the region over the drain region 7A, to the region over the central field oxide film 2, and to the region over the drain region 7B. The polycrystalline silicon pattern 11B extends from the region over the source region 6B, to the region over the right field oxide film 2, and to the region over the polycrystalline silicon wiring pattern 4C.

After the polycrystalline silicon film is patterned, the resist mask 12 is removed by ashing. This ashing process is performed, for example, under the conditions that a barrel type plasma asher is used, the pressure in the ashing chamber is maintained about 1 tort, and an RF power of 1 kW is applied to generate oxygen plasma.

Figure 2C:
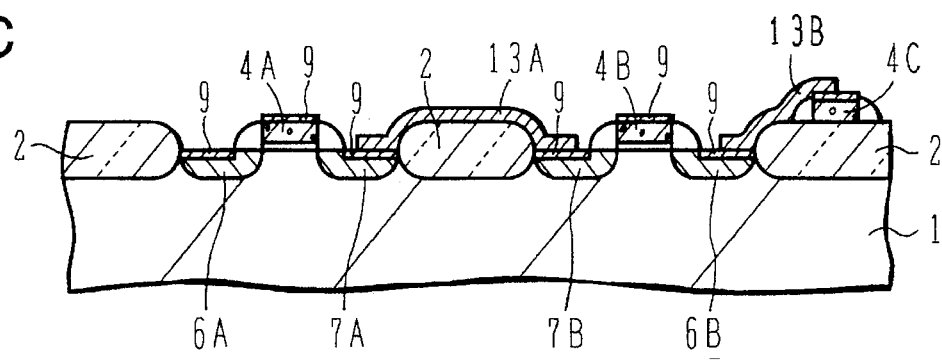

The Ni film 10 not covered with the polycrystalline silicon film is oxidized by about 4 nm under the above ashing conditions. However, this damage is confined within the Ni film 10, and the underlying Co silicide layers 9 and silicon substrate i are not damaged. As shown in FIG. 2C, a heat treatment is performed at a temperature of 400° C. for 20 minutes to silicify the Ni film 10 with the polycrystalline silicon patterns 11A and lib to form Ni silicide patterns 13A and 13B. Thereafter, the unreacted Ni film is removed.

At the temperature of 400° C., Co (or Co silicide) hardly reacts with Si, and so the silicide layers 9 scarcely grow deeper into the source regions 6A and 6B and drain regions 7A and 7B. Therefore, even if the source/drain regions are made shallow, the silicide layers 9 do not break through p-n junctions to reach the substrate 1 so that leak current can be prevented.

As described above, leak current via shallow source/drain regions can be prevented by using metal which can be silicified at a lower temperature than the first silicifying process, at the second silicifying process, and by setting the second silicifying temperature lower than the first silicifying temperature. If Co is used at the first silicifying process, the silicifying temperature is preferably set to 700° C. or lower.

One end of the Ni silicide pattern 13A makes contact with the Co silicide layer 9 formed in the surface of the drain region 7A, and the other end thereof makes contact with the Co silicide layer 9 formed in the surface of the drain region 7B. One end of the Ni silicide pattern 13B makes contact with the Co silicide layer 9 formed in the surface of the drain region 7B, and the other end thereof makes contact with the Co silicide layer 9 formed over the polycrystalline silicon wiring pattern 4C.

Next, similar to a general LSI manufacturing step, an interlevel insulation film is deposited by CVD, and a contact hole is formed in the interlevel insulation film, and a metal wiring layer filling the contact hole is formed on the interlevel insulation film.

In the above-described first embodiment, the Co silicide layer 9 is already present at the ashing process for the resist mask 12 described with FIG. 2B. Therefore, even if the Ni film 10 is damaged by ashing, this damage hardly affects the source/drain regions, gate electrodes, and polycrystalline wiring pattern, respectively with already lowered resistances.

By reversing the conductivity type of all elements, p-channel MOS transistors can be manufactured by similar processes. In a CMOS device, p-channel MOS transistors are formed in n-wells, and n-channel MOS transistors are formed in p-wells.

In the first embodiment, although Co silicide is formed by the first silicifying process described with FIG. 2A and Ni silicide is formed by the second silicifying process described with FIG. 2C, silicide of other metals may be formed. Silicide of the same metal may be formed both by the first and second silicifying processes. For example, as metals of silicide, titanium, tungsten, platinum, chromium, and molybdenum may be used.

In the first embodiment, as shown in FIG. 2B, the Ni film 10 is formed as a lower level layer and the polycrystalline silicon patterns 11A and 11B are formed as a higher level layer. This lamination may be interchanged so that the polycrystalline silicon layer is formed as a lower level layer and the Ni patterns are formed as a higher level layer. The lower level film may be patterned and the higher level film may be deposited over the whole surface of the substrate.

Next, the second embodiment of the invention will be described with reference to FIGS. 3A to 3D which are cross sectional views illustrating a method of manufacturing a semiconductor device of this embodiment. Only main parts are shown and other elements not necessary for explaining a local interconnect forming method are omitted.

Figure 3A:
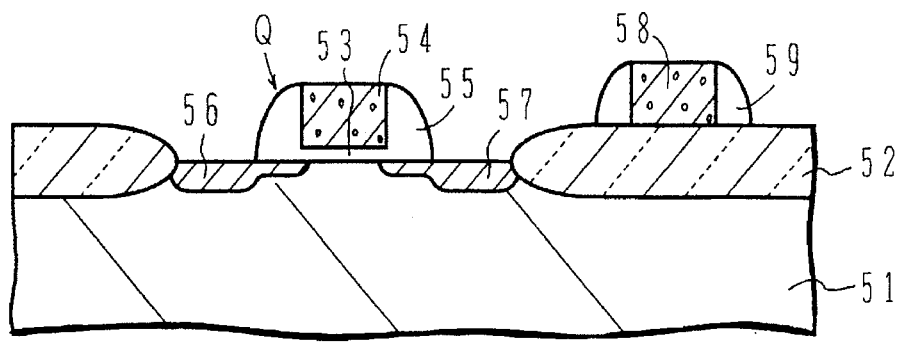
FIGS. 3A to 3D are cross sectional views of a substrate which is subject to processes of a method of forming local interconnects according to a second embodiment of the invention.

As shown in FIG. 3A, a MOS transistor of an LDD structure is formed in the surface of a substrate 51 at the area surrounded by a field oxide film 52, by usual processes. A MOS transistor Q is an n-channel MOS transistor formed in a p-type silicon region 51. A silicon gate electrode 54 is formed on a gate insulation film 53, oxide films of side wall oxide regions 55 being formed on both sides of the silicon gate electrode. An n-type source region 56 and a p-type drain region 57 are formed in the active regions of the substrate 51 on opposite sides of the silicon gate electrode 54.

A silicon wiring pattern 58 connected to the gate of another transistor not shown extends on the field oxide film 52 on the right-most side of FIG. 3A. Oxide films of side wall oxide regions 59 are formed on both sides of the silicon wiring pattern. The following description is directed to a method of forming a local interconnect for connecting the drain region 57 of the MOS transistor Q to the silicon wiring pattern 58.

Figure 3B:
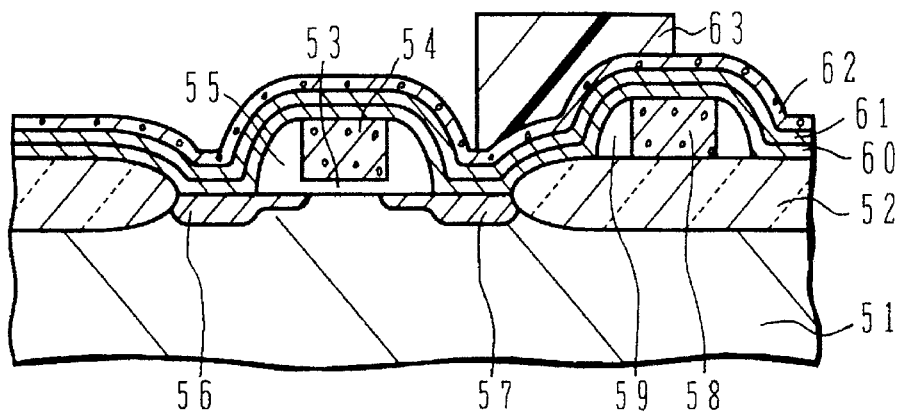

As shown in FIG. 3B, on the surface of the substrate 51, a Co film 60 of about 10 nm thick, a platinum (Pt) film 61 of about 3 nm thick, and an Si film 62 of about 30 nm thick are formed in this order from the bottom by spattering. A resist mask 63 is formed covering the area where the Si film 62 is to be left.

Figure 3C:
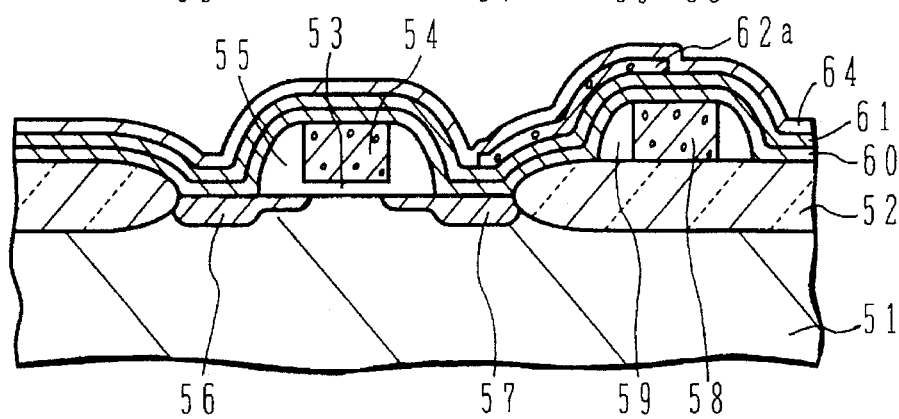

As shown in FIG. 3C, the Si film 62 is etched to form an Si film pattern 62a. The Si film 62 is etched, for example, by using a usual parallel plate RIE system under the conditions that $SF_6$ gas as etching gas is flowed at a flow rate of about 100 sccm, the pressure is maintained about 50 mtorr, and an RF power of about 200 W is supplied.

After etching, the resist pattern 63 is removed by a down-flow ashing system using oxygen plasma. During ashing, since ashing residue is generally produced, this is removed by resist development liquid. It is considered that generation of ashing residue results from a change in compositions of resist during etching the Si film 62.

Thereafter, the substrate is carried to a sputtering system to deposit a TiN film 64 to a thickness of about 50 nm by reactive sputtering in a nitrogen atmosphere. The Si film pattern 62a is made cradled in a laminate of the Pt film 61 and TiN film 64.

Thereafter, the substrate is heated to about 600° C., for example, through rapid thermal annealing (RTA) to proceed a silicifying process between the Pt film 61 and Co film 60. Silicification progresses at the contact areas of the Co film 60 with the surfaces of the substrate 51, gate electrode 54, and silicon wiring pattern 58 and at the contact area of the Pt film 61 with the Si film pattern 62a.

Figure 3D:
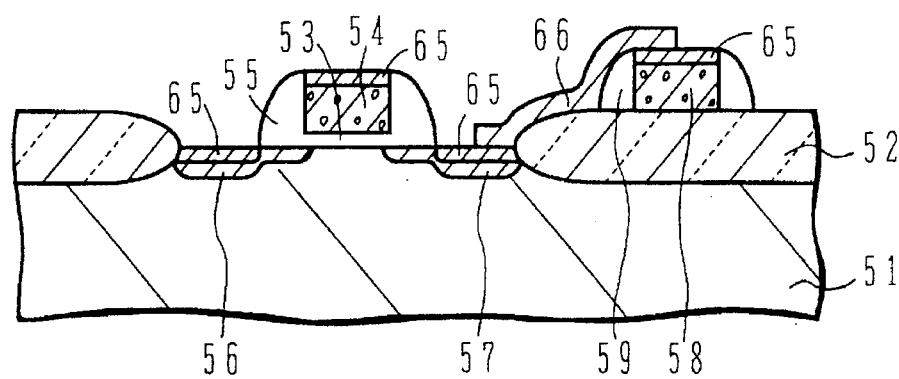

As shown in FIG. 3D, after a silicide local interconnect 66 is formed at the area where the Si film pattern 62a is formed, the remaining TiN film 64 and unreacted Pt film 61 are removed by mixed solution of $NH_4+H_2O_2$, and then the unreacted Co film 60 is removed by mixed solution of $H_2SO_4$ and $H_2O_2$ (1:1). The unreacted Co film may be removed by $HCL+H_2O_2$ (1:1).

In the above manner, the silicide layer 65 can be formed on the surface of Si, and the local interconnect 66 can be formed riding over the field oxide film 52. Not only an interlevel insulation film is not required between the local interconnect 66 and its underlying silicon wiring pattern 58, but also a contact hole is not necessary which requires precise overlay alignment. Patterning for the local interconnect 66 does not require a high degree of overlay alignment. Therefore, fine LSI structures can be easily formed.

In the second embodiment illustrated in FIGS. 3A to 3D, before ashing residue of the resist mask 63 is removed by using resist development liquid, the surface of the Co film 60 has already been covered with the Pt film 61. Since Pt is not susceptible to damages by development liquid, the underlying Co film 60 is hardly damaged. Since generally the uniform Co film 60 remains during the silicifying process on the surface of the substrate, on the upper surfaces of the gate electrode 54 and silicon wiring pattern 58, and on the lower surface of the Si film pattern 62a, the silicide film 65 of good quality can be formed.

In the second embodiment, the silicifying process is performed under the condition that the surfaces of the Si film pattern 62a and Pt film 61 are covered with the TiN film 64. Since the Si film pattern 62a is covered with the TiN film 64, the Si film pattern is not oxidized and the silicide film 65 of good quality can be formed.

Next, the third embodiment will be described with reference to FIGS. 4A and 4B wherein a silicide layer is used as a contact pad.

Figure 4A:
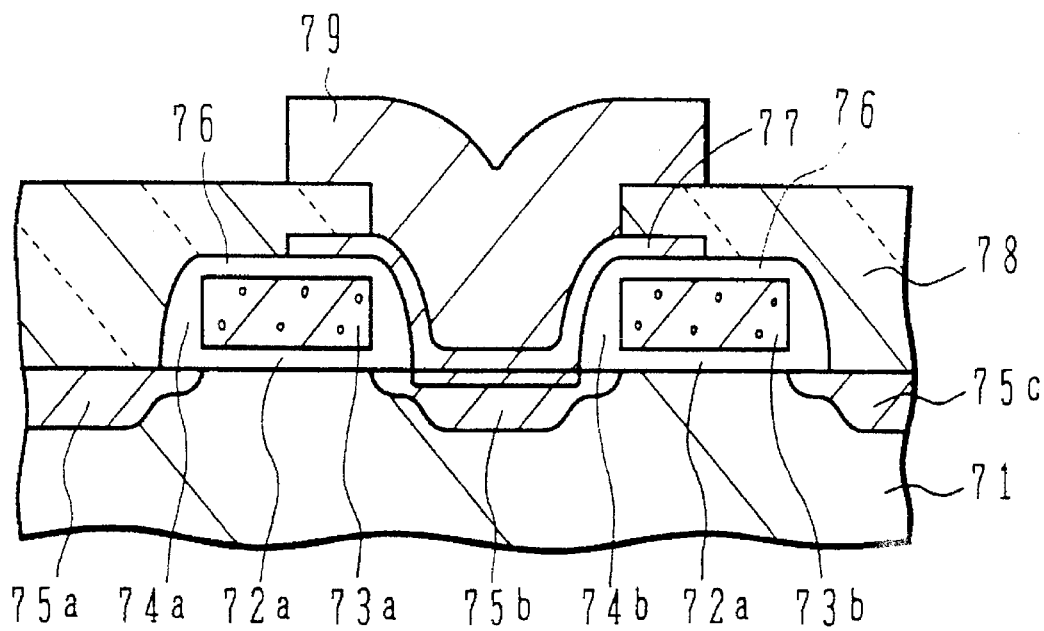
FIGS. 4A and 4B are cross sectional views showing a contact pad of a substrate according to an embodiment of the invention, the silicide layers formed by the first or second embodiment being used as the contact pads.

In FIG. 4A, a gate oxide film 72a is formed on the surface of, for example, a p-type Si substrate. Silicon gate electrodes 73a and 73b are formed on the gate oxide films 72a. The surfaces of the gate electrodes 73a and 73b are covered with an insulation film 76. The side walls of the gate electrodes are also covered with insulation films 74a and 74b. By using the gate electrodes as a mask, ions are implanted to form n-type regions 75a, 75b, and 75c on the surface region 71 of the p-type substrate.

A silicide pad 77 is formed to extend from the n-type regions 75b to the insulation films 76 covering the adjacent two gate electrodes 73a and 73b. The pad 77 has an area broader than the exposed surface of the Si substrate 71. The structure shown in FIG. 4A can be formed by adding a step of forming the insulation film 76 to the method of either of the first and second embodiments.

An interlevel insulation film 78 is formed covering the pad 77, and a contact hole is formed in the interlevel insulation film 78. This contact hole is aligned in position with the pad 77. This alignment precision may be rougher than that of the exposed surface of the n-type region 75b.

Thereafter, an electrode layer 79 such as an Al layer is formed over the Si substrate 71 and patterned to form a wiring 79 which is connected via the pad 77 to the n-type region 75b.

Figure 4B:
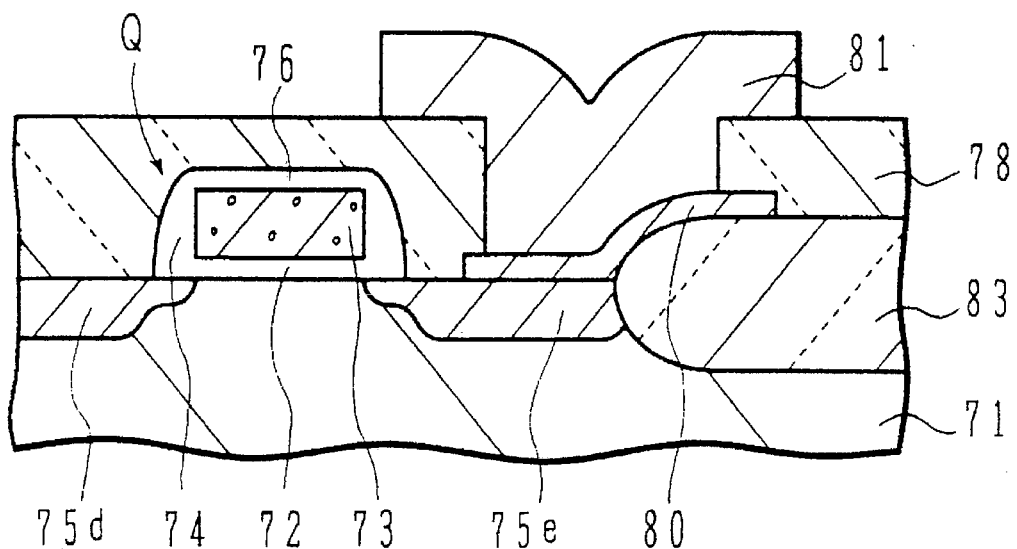

FIG. 4B shows another example of the third embodiment. A field oxide film 83 is formed on the surface of an Si substrate 71, and a MOS transistor Q is formed in the active region defined by the field oxide film 83. The MOS transistor Q has the structure that an insulation film 76 covers the surface of the gate electrode, similar to the MOS transistor shown in FIG. 4A.

Specifically, a laminated layer of a gate insulation film 72, gate electrode 73, and insulation film 76 is formed on the surface of the Si substrate 71. This laminated layer is patterned to form a gate electrode structure with an insulated surface. The sides of the gate electrode structure are covered with an insulation film to form side wall oxide regions 74. On both the sides of the gate electrode, n-type regions 75d and 75e are formed.

A silicide pad 80 is formed by the method similar to the above embodiments, the silicide pad 80 extending from the surface of the n-type region 75e to the surface of the field oxide film 83. Thereafter, the surface of the substrate is covered with an interlevel insulation film 78, and an opening for the pad 80 is formed therein. Here, the pad 80 serves as an etching stopper.

Thereafter, a wiring layer such as an Al layer is formed on the surface of the substrate, and patterned to form a wiring 81. An interconnect between the wiring 81 and the n-type region 75e is realized by using the pad 80, thereby relieving a precise position alignment.

In the embodiments described above, a Co film having a thickness of about 10 nm has been used. The thickness may be set to a desired value in the range from 5 to 50 nm. A Si film having a thickness of about 50 nm has been used. The thickness may be set to a desired value in the range from 20 to 200 nm. The processes of patterning the Si film and TiN film are not limited to those described in the embodiments. A silicide electrode and interconnect can be applied to circuits other than the embodiment circuits.

Figure 5A:
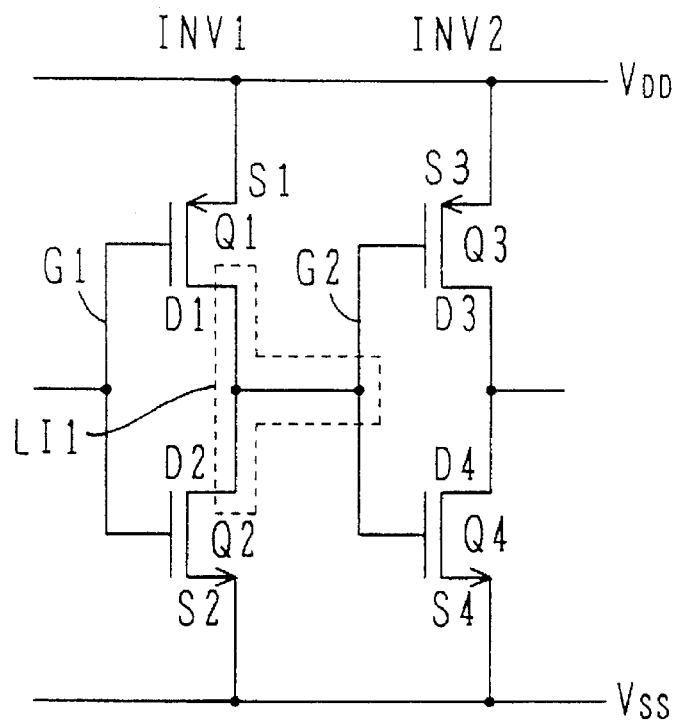
FIGS. 5A and 5B are equivalent circuits of electronic circuits suitable for using local interconnects.
Figure 5B:
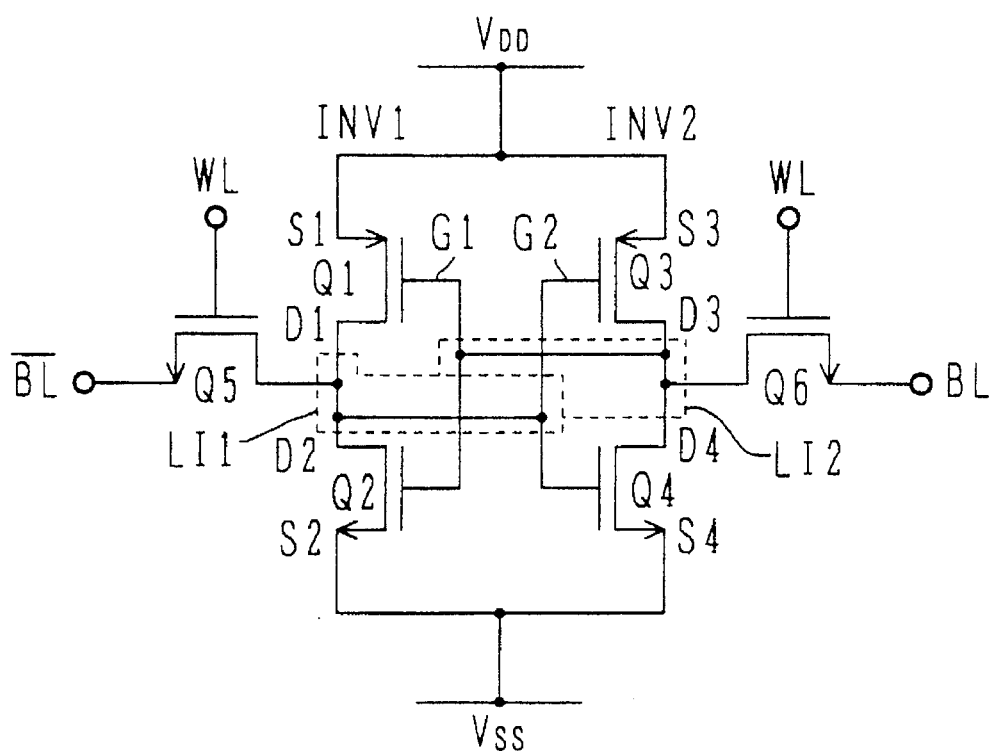

Next, embodiments which apply level interconnect using a silicification reaction to a ring oscillator and an SRAM will be described, referring to FIGS. 5A, 5B, 6A, 6B, and 7. FIG. 5A is an equivalent circuit showing part of a ring oscillator, and FIG. 5B is an equivalent circuit of an SRAM cell.

In FIG. 5A, two inverters INV1 and INV2 are connected between a power supply voltage line $V_{DD}$ and a ground line $V_{SS}$ (or between two power supply lines). In the first inverter INV1, the source S1 of a p-channel MOS transistor Q1 is connected to the power supply line $V_{DD}$, and the drain D1 thereof is directly connected to the drain D2 of an n-channel MOS transistor Q2. The source S2 of the n-channel MOS transistor Q2 is connected to the ground line $V_{SS}$. The gates of the two transistors Q1 and Q2 are connected in common to a gate electrode G1 to which an input signal common to transistors Q1 and Q2 is applied.

In the second inverter INV2, the source S3 of a p-channel MOS transistor Q3 is connected to the power supply line $V_{DD}$, and the drain D3 thereof is directly connected to the drain D4 of an n-channel MOS transistor Q4. The source S4 of the n-channel MOS transistor Q4 is connected to the ground line $V_{SS}$. The gates of the two transistors Q3 and Q4 are connected in common to a gate electrode G2. An output line connected to the drains D1 and D2 of the first inverter INV1 is connected to the gate electrode G2 of the second inverter INV2.

A plurality of inverters INV is cascaded between the two power supply lines $V_{DD}$ and $V_{SS}$ in the similar manner described above. The output line from the drains D1 and D2 of the first inverter INV1 is connected by a local interconnect LI1 to the gate G2 of the second inverter INV2.

In FIG. 5B, two inverters INV1 and INV2 are connected between the two power supply lines $V_{DD}$ and $V_{SS}$ similar to the circuit of FIG. 5A. The drains D1 and D2 of the first inverter INV1 are connected by a local interconnect LI1 to the gate electrode G2 of the second inverter INV2.

In the circuit shown in FIG. 5B, an output line from the drains D3 and D4 of the second inverter INV2 is fed back by a local interconnect LI2 to the gate electrode G1 of the first inverter INV1.

An output line of the first inverter INV1 is connected via a transfer transistor Q5 to a bit line BL (BL bar), and the output line from the second inverter INV2 is connected via a transfer transistor Q6 to a bit line BL. The gates of the two transistors Q5 and Q6 are connected to a word line WL.

Figure 6A:
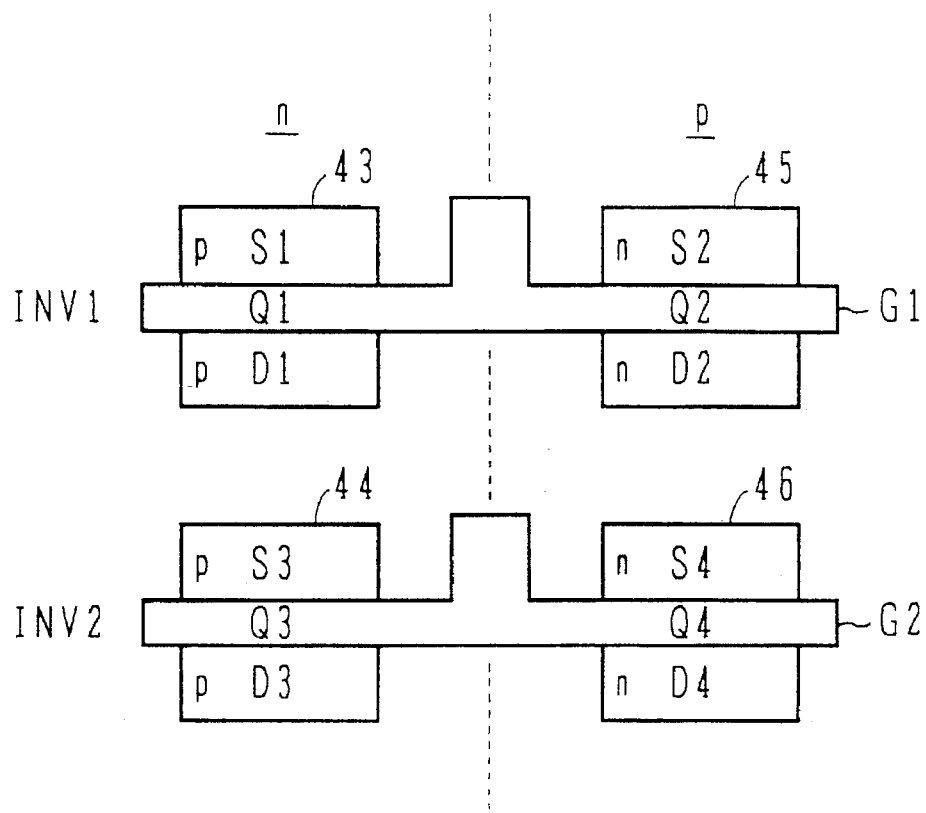
FIGS. 6A and 6B are plan views showing the structure of a semiconductor device realizing the circuit shown in FIG. 5A.
Figure 6B:
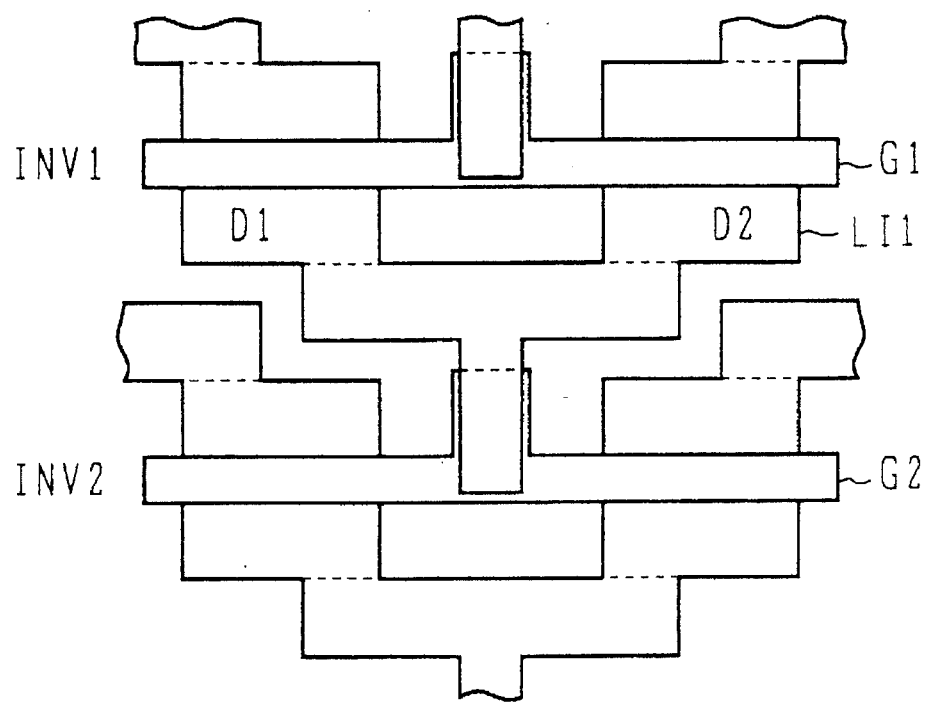

FIGS. 6A and 6B are schematic plane views of a semiconductor device forming part of the ring oscillator shown in FIG. 5A. FIG. 6A is a plane view showing the semiconductor device having gate electrodes formed in the semiconductor substrate and having source/drain regions. In FIG. 6A, an n-well is formed on the left side and a p-well is formed on the right side.

The other region than the n-well surface regions 43 and 44 are covered with a field oxide film. The region other than the p-well surface regions 45 and 46 are also covered with a field oxide film. The gate electrode G1 passes through the surface regions 43 and 45 with a gate oxide film being interposed therebetween. The gate electrode G2 passes through the surface regions 44 and 46 with a gate oxide film being interposed therebetween.

After the gate electrodes G1 and G2 are formed, the p-well region is covered with a resist mask, and p-type impurity ions are implanted to form the p-type source regions S1 and S2 and the p-type drain regions D1 and D3, respectively in the n-well region.

Similarly, the n-well region is covered with a resist mask, and n-type impurity ions are implanted to form the n-type source regions S2 and S4 and the p-type drain regions D2 and D4, respectively in the p-well region. In this manner, the basic structure of the four MOS transistors shown in FIG. 5A is formed.

FIG. 6B shows cascaded inverters connected by the local interconnect LI which is formed on the basic structure shown in FIG. 6A by a method similar to the first or second embodiment. The local interconnect LI1 interconnects the two drains D1 and D2 of the first inverter INV1 and the gate electrode G2 of the second inverter INV2. The local interconnect LI1 is formed on the field oxide film excepting the portion thereof over the two drain regions D1 and D2 and gate electrode G2, and is not necessary to use an interlevel insulation film so as to electrically separate it from other circuit elements.

Figure 7:
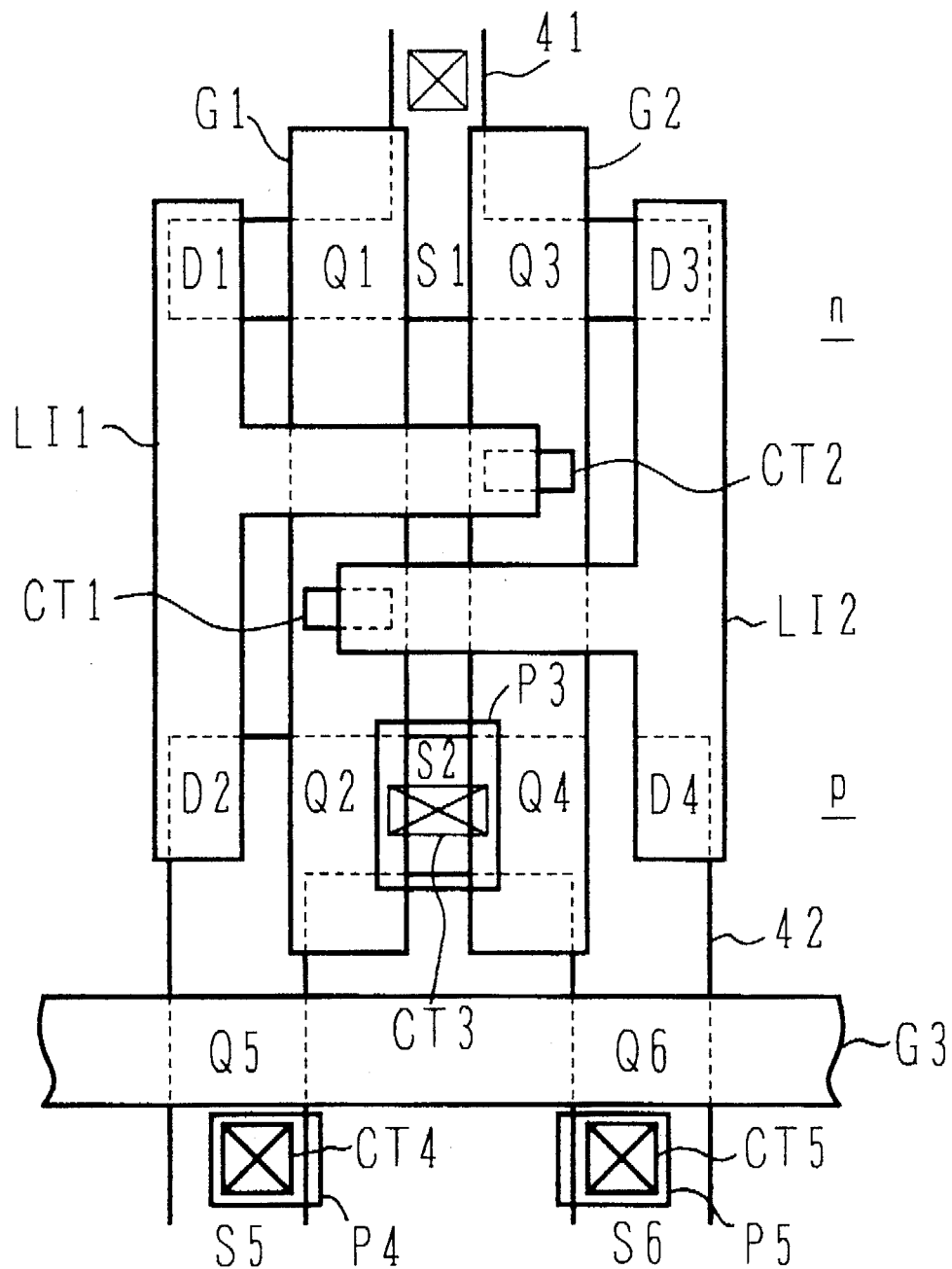
FIG. 7 is a plan view showing the structure of a semiconductor device realizing the circuit shown in FIG. 5B.
Figure 8A:
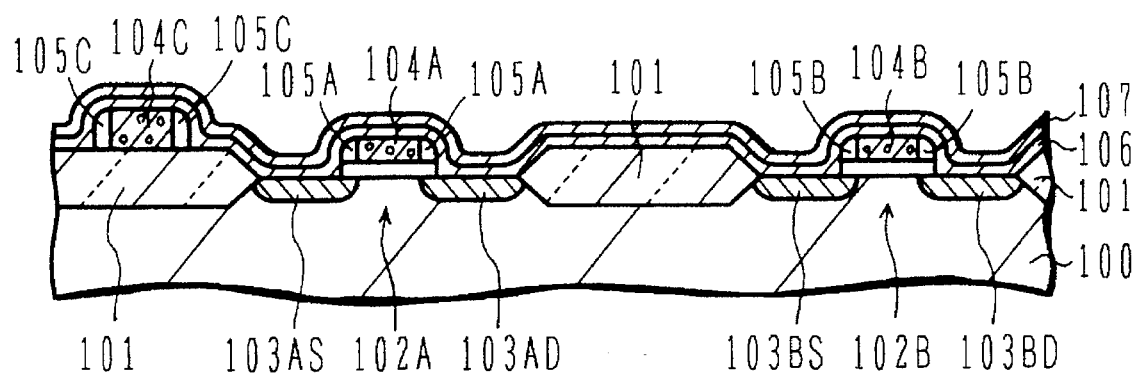
FIGS. 8A to 8D are cross sectional views illustrating a conventional method of manufacturing semiconductor devices.
Figure 8B:
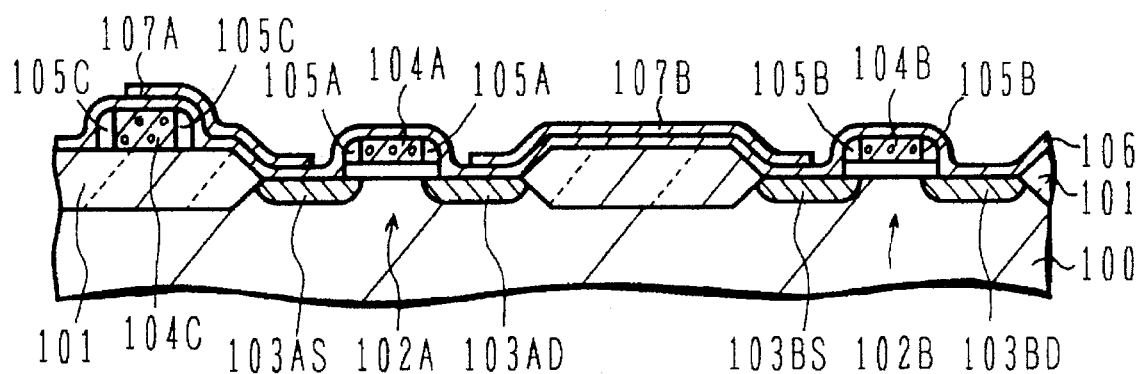
Figure 8C:
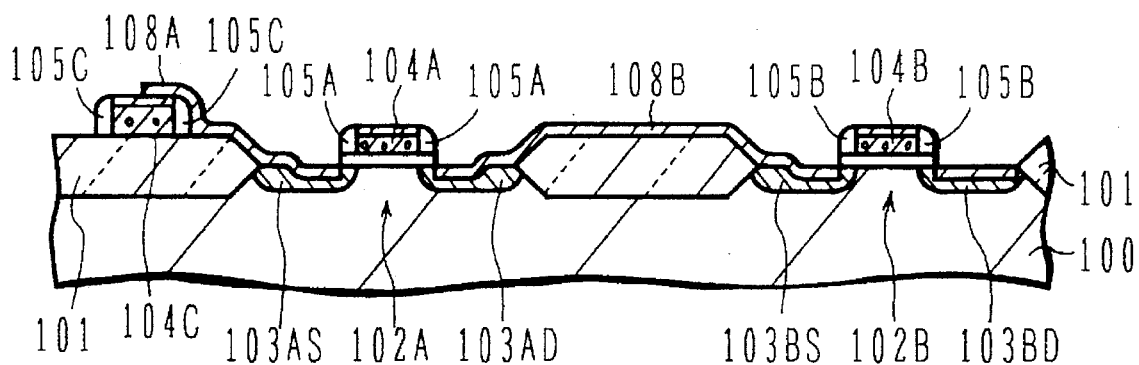
Figure 8D:
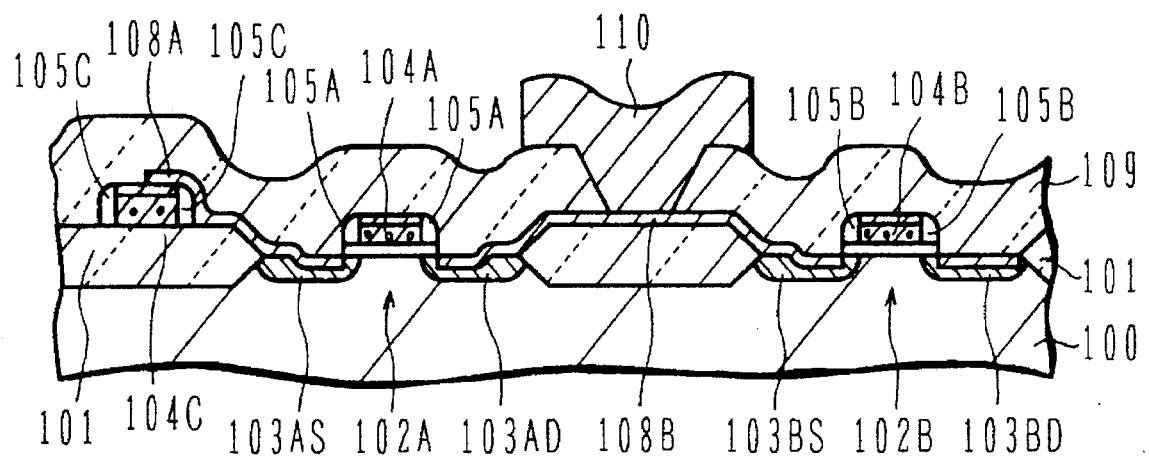

FIG. 7 is a plane view of a semiconductor device showing an example of the structure of the SRAM shown in FIG. 5B. In order to form cross local interconnects shown in FIG. 5B, the layout is different from FIGS. 6A and 6B.

In FIG. 7, an n-well is formed on the upper side, and a p-well is formed on the lower side. A surface region 41 in the n-well is surrounded and defined by a field oxide film. Similarly, a surface region 42 in the p-well is surrounded and defined by the field oxide film. The other Si surface than the surface regions 41 and 42 is covered with the field oxide film.

The active region 41 of pMOS is of an inverted T-shape, and the active region 42 of nMOS is of an inverted U-shape. The two gates G1 and G2 are formed passing through the horizontal area of the T-shaped surface region 41 and the horizontal area of the U-shaped surface region 42. In this structure, the gate G3 is also formed on the lower side of FIG. 7.

By using these gates G1, G2, and G3 as a mask, ions are implanted. The surface region 41 not covered with the gate electrodes G1 and G2 is doped with p-type impurity ions, and the surface region 42 not covered with the gate electrodes G1, G2, and G3 is doped with n-type impurity ions.

In the above manner, the four MOS transistors Q1, Q2, Q3, and Q4 similar to FIGS. 6A and 6B and the other two MOS transistors Q5 and Q6 are formed.

Of this structure, a common region indicated by S1 in FIG. 7 is used as the source regions of the two MOS transistors Q1 and Q3. Another common region indicated by S2 is used as the source regions of the two MOS transistors Q2 and Q4. The drain regions D2 and D4 of the two MOS transistors Q5 and Q6 are the common regions shared by the drain regions of the two MOS transistors Q2 and Q4.

After the basic structure described above is formed, the surface of the gate electrodes G1, G2, and G3 is covered with an insulation film which is thereafter removed only at contact regions CT1 and CT2. Specifically, the gate electrodes are exposed only at the contact regions CT, and only the substrate surface regions 41 and 42 not covered with the gate electrodes G1, G2, and G3 are exposed.

Thereafter, the local interconnects LI1 and LI2 are formed by the methods of the first or second embodiment. The local interconnect LI1 interconnects the drain regions D1 and D2 and the contact region CT2 of the gate electrode, and the local interconnect LI2 interconnects the drain regions D3 and D4 and the contact region CT1 of the gate electrode G1.

Each of the local interconnects LI1 and LI2 contacts the underlying semiconductor surface at three points, and the other portion of each local interconnect is disposed on the insulation film. Therefore, in forming the local interconnects LI1 and LI2, an interlevel insulation film is not needed.

An interlevel insulation film is then formed on the local interconnects LI1 and LI2. Contact holes CT3, CT4, and CT5 are formed in the interlevel insulation film to expose the surfaces of the source regions S2, S5, and S6.

The overlay alignment precision of the contact hole CT3 can be relieved as described with FIG. 4A by forming the silicide pad P3 which covers the surface of the source region S2 and extends to the insulating films covering the adjacent two gate electrodes G1 and G2. The overlay alignment precision of the contact holes CT4 and CT5 can also be relieved as described with FIG. 4B by forming the silicide pads P4 and P5 which extend from the surfaces of the source regions S5 and S6 and ride on the field oxide films.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device comprising the steps of:

forming a locally oxidized field oxide film by selectively oxidizing the surface of a silicon semiconductor substrate and defining a silicon surface surrounded at least partially by a locally oxidized field oxide film;

depositing a film of a first metal on the substrate, the first metal film covering said silicon surface and said locally oxidized field oxide film;

forming a silicon electrode pattern on said locally oxidized field oxide film;

heating said substrate to silicify said first metal film with said silicon surface and form a first silicide layer and to silicify said first metal film with said silicon electrode pattern to form a second silicide layer;

removing unreacted part of said first metal film;

depositing a second metal film of a second metal, said second metal being different from said first metal and capable of forming said second silicide at a temperature where said first metal does not react with silicon, on the substrate, the second metal film covering said first silicide layer and said locally oxidized field oxide film;

depositing a silicon film on said second metal film, and patterning said silicon film to form a silicon film pattern extending from a region over the surface of said first silicide layer, through a region over said locally oxidized field oxide film, to a region over said second silicide layer;

heating said substrate to silicify said second metal film with said silicon film pattern and form a third silicide layer, without enhancing silicidation of said first silicide; and removing unreacted part of said second metal film.

2. A method according to claim 1, wherein said step of forming said silicon electrode pattern comprises the steps of:

depositing a silicon layer;

patterning said silicon layer to form a patterned silicon layer having an exposed top surface and exposed side walls; and forming a side wall insulation film on the side walls of said patterned silicon layer.

3. A method according to claim 2, wherein:

said step of forming a locally oxidized field oxide film and a silicon surface forms a locally oxidized field oxide film or films defining at least two n-channel MOS transistor regions and two p-channel MOS transistor regions;

the method further comprises a step of forming a gate insulation film on each of said four MOS transistor regions prior to said step of forming said silicon electrode pattern; and said step of forming said silicon electrode pattern concurrently forms two gate electrode patterns each shared by one of said two n-channel transistors and a corresponding one of said two p-channel transistors.

4. A method according to claim 3, wherein said step of depositing a silicon film and patterning said silicon film forms a silicon film pattern interconnecting silicon surfaces of drains of the two MOS transistors sharing one of said two gate electrode patterns and the gate electrode pattern of the other two MOS transistors sharing the other of said two gate electrode patterns.

5. A method according to claim 4, wherein the semiconductor device includes a parallel circuit of CMOS inverter circuits each of which includes complementary transistors with drains directly coupled, and said silicon film pattern interconnects the drains of the CMOS inverter circuit of one stage and the gates of the CMOS inverter circuit of a succeeding stage.

6. A method according to claim 5, wherein the semiconductor device includes a SRAM cell having a parallel circuit of CMOS inverter circuits each of which includes complementary transistors with drains, directly connected, and said step of depositing a silicon film and patterning said silicon film forms one silicon film pattern interconnecting the drains of one of the CMOS inverter circuits to the gate of the other CMOS inverter circuit and another silicon film pattern interconnecting the drains of the other CMOS inverter circuit to the gate of the one CMOS inverter circuit.

7. A method according to claim 1, wherein said first metal is a metal selected from the group consisting of titanium, cobalt, tungsten, platinum, chromium, and molybdenum, and said second metal is nickel.

8. A method of manufacturing a semiconductor device comprising the steps of:

forming a locally oxidized field oxide film by selectively oxidizing the surface of said silicon semiconductor substrate and defining a silicon surface surrounded at least partially by said locally oxidized field oxide film;

depositing a first metal film of a first metal on the substrate, the first metal film covering said silicon surface and said locally oxidized field oxide film;

heating said substrate to silicify said first metal film with said silicon surface and form a first silicide layer; and removing unreacted part of said first metal film;

depositing a silicon film covering said first silicide layer and said locally oxidized field oxide film;

depositing a second metal film of a second metal on said silicon film, and patterning said second metal film to form a second metal film pattern extending from a region over the surface of said first silicide layer to a region over said locally oxidized field oxide film;

heating said substrate to silicify said second metal film pattern with said silicon film and form said second silicide layer; and removing unreacted part of said silicon film.

9. A method according to claim 8, further comprising the step of:

forming a silicon electrode pattern on said locally oxidized field oxide film prior to said step of depositing said first metal film, wherein:

said step of forming said first silicide layer silicifies also said first metal film with said silicon electrode pattern to form a third silicide layer.

10. A method according to claim 9, wherein said step of depositing a second metal film and patterning, said second metal film forms a metal pattern extending from a region over the surface of said first silicide layer, through a region over said locally oxidized field oxide film, to a region over said third silicide layer.

11. A method according to claim 10, wherein:

said step of forming a locally oxidized field oxide film and defining a silicon surface forms a locally oxidized field oxide film or films defining at least two n-channel MOS transistor regions and two p-channel MOS transistor regions;

the method further comprises a step of forming a gate insulation film on each of said four MOS transistor regions prior to said step of forming said silicon electrode pattern; and said step of forming said silicon electrode pattern concurrently forms two gate electrode patterns each shared by one of said two n-channel transistors and a corresponding one of said two p-channel transistors.

12. A method according to claim 11, wherein said step of depositing a silicon film and patterning, said silicon film forms a silicon film pattern interconnecting silicon surfaces of drains of the two MOS transistors sharing one of said two gate electrode patterns and the gate electrode pattern of the other two MOS transistors sharing the other of said two gate electrode patterns.

13. A method according to claim 12, wherein the semiconductor device includes a parallel circuit of CMOS inverter circuits each of which includes complementary transistors with drains directly coupled, and said silicon film pattern interconnects the drains of the CMOS inverter circuit of one stage and the gates of the CMOS inverter circuit of a succeeding stage.

14. A method according to claim 13, wherein the semiconductor device includes an SRAM cell having a parallel circuit of CMOS inverter circuits each of which includes complementary transistors with drains directly connected, and said step of depositing a second metal film and patterning said second metal film, forms one second metal film pattern interconnecting the drains of one of the CMOS invertor circuits to the gate of the other CMOS inverter circuit, and another second metal film pattern interconnecting the drains of the other CMOS inverter circuit to the gate of the one CMOS inverter circuit.

15. A method of manufacturing a semiconductor device comprising the steps of:

forming a locally oxidized field oxide film by selectively oxidizing the surface of said silicon semiconductor substrate and defining a silicon surface surrounded at least partially by said locally oxidized field oxide film;

depositing a first metal film of a first metal on the substrate, the first metal film covering said silicon surface and said locally oxidized field oxide film;

depositing a second metal film on said first metal film;

depositing a silicon film on said second metal, and patterning said silicon film to form a silicon film pattern extending from a region over said silicon surface to a region over said locally oxidized field oxide film;

heating said substrate to silicify said first metal film with said silicon surface and said second metal film with said silicon film pattern; and removing unreacted parts of said first and second metal films.

16. A method according to claim 15, further comprises the step of:

forming a silicon electrode pattern on said locally oxidized field oxide film prior to said step of depositing said first metal film, wherein:

said step of heating the substrate concurrently silicifies also said first metal film with said silicon electrode pattern to form a third silicide layer; and said step of depositing a silicon film and patterning said silicon film forms a silicon film pattern extending from a region over said silicon surface, through a region over said locally oxidized field, to a region over said third silicide layer.

17. A method according to claim 16, wherein said step of forming a silicon electrode pattern comprises the steps of:

depositing a silicon layer;

patterning said silicon layer to form a patterned silicon layer having an exposed top surface and exposed side walls; and forming a side wall insulation film on the side walls of said patterned silicon layer.

18. A method according to claim 17, wherein:

said step of forming a locally oxidized field oxide film and defining a silicon surface forms a locally oxidized field oxide film or films defining at least two n-channel MOS transistor regions and two p-channel MOS transistor regions;

the method further comprises a step of forming a gate insulation film on each of said four MOS transistor regions prior to said step of forming said silicon electrode pattern; and said step of forming said silicon electrode pattern forms two gate electrode patterns each shared by one of said two n-channel transistors and a corresponding one of said two p-channel transistors.

19. A method according to claim 18, wherein said step of depositing a silicon film and patterning, said silicon film forms a silicon film pattern interconnecting silicon surfaces of drains of the two MOS transistors sharing one of said two gate electrode pattern and the gate electrode pattern of the other two MOS transistors sharing the other of said two gate electrode patterns.

20. A method according to claim 19, wherein the semiconductor device includes a parallel circuit of CMOS inverter circuits each of which includes complementary transistors with drains directly coupled, and said silicon film pattern interconnects the drains of the CMOS inverter circuit of one stage and the gates of the CMOS inverter circuit of a succeeding stage.

21. A method according to claim 20, wherein the semiconductor device includes an SRAM cell having a parallel circuit of CMOS inverter circuits each of which includes complementary transistors with drains directly connected, and said step of depositing a silicon film and patterning said film forms one silicon film pattern interconnecting the drains of one of the CMOS inverter circuits to the gate of the other CMOS inverter circuit and another silicon film pattern interconnecting the drains of the other CMOS inverter circuit to the gate of the one CMOS inverter circuit.

22. A method of manufacturing a semiconductor device comprising the steps of:

forming a locally oxidized field oxide film by selectively oxidizing the surface of said silicon semiconductor substrate and defining a silicon surface surrounded at least partially by said locally oxidized field oxide film;

depositing a first metal film of said first metal on the substrate, the first metal film covering said silicon surface and said locally oxidized field oxide film, depositing a second metal film on said first metal film, said second metal film being made of metal different from said first metal, said first and second metal being capable of silicifying with silicon;

depositing a silicon film on said second metal film, and patterning said silicon film to form a silicon film pattern extending from a region over said silicon surface to a region over said locally oxidized field oxide film;

heating said substrate to silicify said first metal film with said silicon surface and said second metal film with said silicon film pattern; and removing unreacted parts of said first and second metal films.

23. A method according to claim 22, further comprising the step of:

forming a silicon electrode pattern on said locally oxidized field oxide film prior to said step of depositing said first metal film, wherein:

said step of heating the substrate concurrently silicifies also said first metal film with said silicon electrode pattern to form a third silicide layer; and said step of depositing a silicon film and patterning said silicon film forms a silicon film pattern extending from a region over said silicon surface, through a region over said locally oxidized field, to a region over said third silicide layer.

24. A method according to claim 23, wherein said step of forming a silicon electrode pattern comprises the steps of:

depositing a silicon layer;

patterning said silicon layer to form a patterned silicon layer having an exposed top surface and exposed side walls; and forming a side wall insulation film on the side walls of said patterned silicon layer.

25. A method according to claim 24, wherein:

said step of forming a locally oxidized field oxide film and defining a silicon surface forms a locally oxidized field oxide film or films defining at least two n-channel MOS transistor regions and two p-channel MOS transistor regions;

the method further comprises a step of forming a gate insulation film on each of said four MOS transistor regions prior to said step of forming said silicon electrode pattern; and said step of forming said silicon electrode pattern forms two gate electrode patterns each shared by one of said two n-channel transistors and a corresponding one of said two p-channel transistors.

26. A method according to claim 25, wherein said step of depositing a silicon film and patterning, said silicon film forms a silicon film pattern interconnecting silicon surfaces of drains of the two MOS transistors sharing one of said two gate electrode pattern and the gate electrode pattern of the other two MOS transistors sharing the other of said two gate electrode patterns.

27. A method according to claim 26, wherein the semiconductor device includes a parallel circuit of CMOS inverter circuits each of which includes complementary transistors with drains directly coupled, and said silicon film pattern interconnects the drains of the CMOS inverter circuit of one stage and the gates of the CMOS inverter circuit of a succeeding stage.

28. A method according to claim 27, wherein the semiconductor device includes an SRAM cell having a parallel circuit of CMOS inverter circuits each of which includes complementary transistors with drains directly connected, and said step of depositing a silicon film and patterning said film forms one silicon film pattern interconnecting the drains of one of the CMOS inverter circuits to the gate of the other CMOS inverter circuit and another silicon film pattern interconnecting the drains of the other CMOS inverter circuit to the gate of the one CMOS inverter circuit.

29. A method of manufacturing a semiconductor device comprising the steps of:

forming a locally oxidized field oxide film by selectively oxidizing the surface of a silicon semiconductor substrate and defining a silicon surface surrounded at least partially by a locally oxidized field oxide film;

forming a silicon electrode pattern on said locally oxidized field oxide film;

depositing a first nickel film on the substrate, the first nickel film covering said silicon surface and said locally oxidized field oxide film;

heating said substrate to silicify said first nickel film with said silicon surface and form a first nickel silicide layer and to silicify said first metal film with said silicon electrode pattern to form a second nickel silicide layer;

removing unreacted part of said first nickel film;

depositing a second nickel film on the substrate, the second nickel film covering said first nickel silicide layer and said locally oxidized field oxide film;

depositing a silicon film on said second nickel film, and patterning said silicon film to form a silicon film pattern extending from a region over the surface of said first nickel silicide layer, through a region over said locally oxidized field oxide film, to a region over said second nickel silicide layer;

heating said substrate to silicify said second nickel film with said silicon film pattern and form a third nickel silicide layer; and removing unreacted part of said second nickel film.

30. A method of manufacturing a semiconductor device comprising the steps of:

forming a locally oxidized field oxide film by selectively oxidizing the surface of said silicon semiconductor substrate and defining a silicon surface surrounded at least partially by said locally oxidized field oxide film;

depositing a first nickel film on the substrate, the first nickel film covering said silicon surface and said locally oxidized field oxide film;

heating said substrate to silicify said first nickel film with said silicon surface and form a first nickel silicide layer; and removing unreacted part of said first nickel film;

depositing a silicon film covering said first silicide layer and said locally oxidized field oxide film;

depositing a second nickel film on said silicon film, and patterning said second nickel film to form a second nickel film pattern extending from a region over the surface of said first nickel silicide layer to a region over said locally oxidized field oxide film;

heating said substrate to silicify said second nickel film pattern with said silicon film and form a second nickel silicide layer; and removing unreacted part of said silicon film.

31. A method according to claim 30, further comprising the step of:

forming a silicon electrode pattern on said locally oxidized field oxide film prior to said step of depositing said first nickel film, wherein:

said step of forming said first nickel silicide layer silicifies also said first nickel film with said silicon electrode pattern to form a third nickel silicide layer.

* * * * *